(12) United States Patent
Carnevali (10) Patent No.: US 9,570,872 B2
(45) Date of Patent: Feb. 14, 2017

(54) DOCKING STATION HAVING CONNECTOR PRELOAD AND ISOLATOR SYSTEM

(71) Applicant: Jeffrey D. Carnevali, Seattle, WA (US)

(72) Inventor: Jeffrey D. Carnevali, Seattle, WA (US)

(*) Notice: Subject to any disclaimer, the term of this patent is extended or adjusted under 35 U.S.C. 154(b) by 236 days.

(21) Appl. No.: 14/270,289

(22) Filed: May 5, 2014

(65) Prior Publication Data

US 2015/0318653 A1 Nov. 5, 2015

(51) Int. Cl.
| | | |
|---|---|---|
| *H01R 43/24* | (2006.01) | |
| *H05K 3/28* | (2006.01) | |
| *H05K 3/32* | (2006.01) | |
| *G06F 1/16* | (2006.01) | |
| *H01R 43/00* | (2006.01) | |
| *H01R 43/18* | (2006.01) | |
| *B29C 45/14* | (2006.01) | |
| *C08L 23/16* | (2006.01) | |

(52) U.S. Cl.
CPC ............ *H01R 43/24* (2013.01); *G06F 1/1632* (2013.01); *H01R 43/005* (2013.01); *H01R 43/18* (2013.01); *H05K 3/284* (2013.01); *H05K 3/321* (2013.01); *B29C 45/14065* (2013.01); *B29C 45/14639* (2013.01); *B29C 45/14655* (2013.01); *C08L 23/16* (2013.01); *Y10T 29/4922* (2015.01); *Y10T 29/49146* (2015.01); *Y10T 29/49149* (2015.01); *Y10T 29/49171* (2015.01); *Y10T 29/49222* (2015.01); *Y10T 156/10* (2015.01)

(58) Field of Classification Search
CPC ..... G06F 1/1632; H01R 43/005; H01R 43/24; H01R 43/18; B29C 45/14065; B29C 45/14639; B29C 45/14655; C08L 23/16; H05K 3/284; H05K 3/321; Y10T 156/10; Y10T 29/49149; Y10T 29/49146; Y10T 29/49171; Y10T 29/4922; Y10T 29/49222
See application file for complete search history.

(56) References Cited

U.S. PATENT DOCUMENTS

| | | | | | |
|---|---|---|---|---|---|
| 4,293,519 | A | * | 10/1981 | Knappenberger | ..... H05K 3/284 257/E21.502 |
| 4,815,981 | A | * | 3/1989 | Mizuno | .................. H05K 3/321 439/77 |
| 2003/0083434 | A1 | * | 5/2003 | Ouhadi | ................... C08L 23/16 525/80 |
| 2012/0009816 | A1 | * | 1/2012 | Hiraoka | ............ B29C 45/14065 439/488 |

FOREIGN PATENT DOCUMENTS

JP 2011040257 A * 2/2011

* cited by examiner

*Primary Examiner* — A. Dexter Tugbang
(74) *Attorney, Agent, or Firm* — Charles J. Rupnick Attorney at Law (57) ABSTRACT

A method for mounting a rigid electrical connector, including selecting an electrical connector that is compatible with a predetermined portable electronic device; forming an aperture through an interface member, wherein the aperture is larger than the electrical connector; selecting an elastomeric potting material that is compatible with both the electrical connector and the interface member; locating the electrical connector in the aperture with a space between the electrical connector and the interface member; introducing the elastomeric potting material in an uncured state into the space between the electrical connector and the interface member; and while maintaining the space between the electrical connector and the interface member, curing the elastomeric potting material in the space therebetween.

20 Claims, 6 Drawing Sheets

DOCKING STATION HAVING CONNECTOR PRELOAD AND ISOLATOR SYSTEM

FIELD OF THE INVENTION

The present invention relates generally to docking stations for portable electronic devices, and in particular to isolators for retaining secure connection of expansion connectors of active docking stations with input/output (I/O) communication ports of portable computers and other portable electronic devices seated in the docking station.

BACKGROUND OF THE INVENTION

Docking stations for portable computers and other portable electronic devices are generally well-known, including active docking stations having an expansion connector connectable with an input/output (I/O) communication port of a portable computer and other portable electronic device seated therein.

However, known active docking station apparatus are limited in their ability to efficiently provide secure connection between the expansion connector of the docking station apparatus and the I/O communication port of the portable computer or other portable electronic device during exposure to shock and vibration environments applied along the direction of insertion of the expansion connector.

SUMMARY OF THE INVENTION

The present invention is a docking station for a portable computer or other portable electronic device. The docking station having a docking tray formed of a tray body formed with a bearing surface that is adapted for receiving thereon a body portion of the portable electronic device. A device receiver structure is positioned adjacent to an edge of the bearing surface of the tray body, and a device clamping mechanism is coupled opposite from the receiver structure for cooperating therewith. At least one substantially resilient preload mechanism is positioned adjacent to bearing surface with at least a portion thereof being projected thereabove. A floating expansion connector that is connectable with the device I/O connector is projected from the bearing surface and is resiliently movable in three dimensions relative thereto.

For example, the floating expansion connector includes an isolator system having a mounting plate with a contact surface and an opposing operational surface and an aperture extended therebetween; a plurality of backstops spaced a distance away from the operational surface of the mounting plate; a printed circuit board (PCB) or other connector carrier member that is movable out-of-plane between the backstop and the operational surface of the mounting plate, and a plurality of in-plane isolators mounted therein with an electrical connector mounted thereon in a position to pass through the aperture in the mounting plate; and one or more biasing members arranged for urging the connector carrier member toward the mounting plate and the electrical connector through the aperture therein.

Other aspects of the invention are detailed herein.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

As required, a detailed illustrative embodiment of the present connector isolator is disclosed herein. However, techniques, systems and operating structures in accordance with the present connector isolator may be embodied in a wide variety of forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein which define the scope of the present connector isolator. The following presents a detailed description of an illustrative embodiment (as well as some alternative embodiments) of the present connector isolator.

In the Figures, like numerals indicate like elements.

Figure 1:
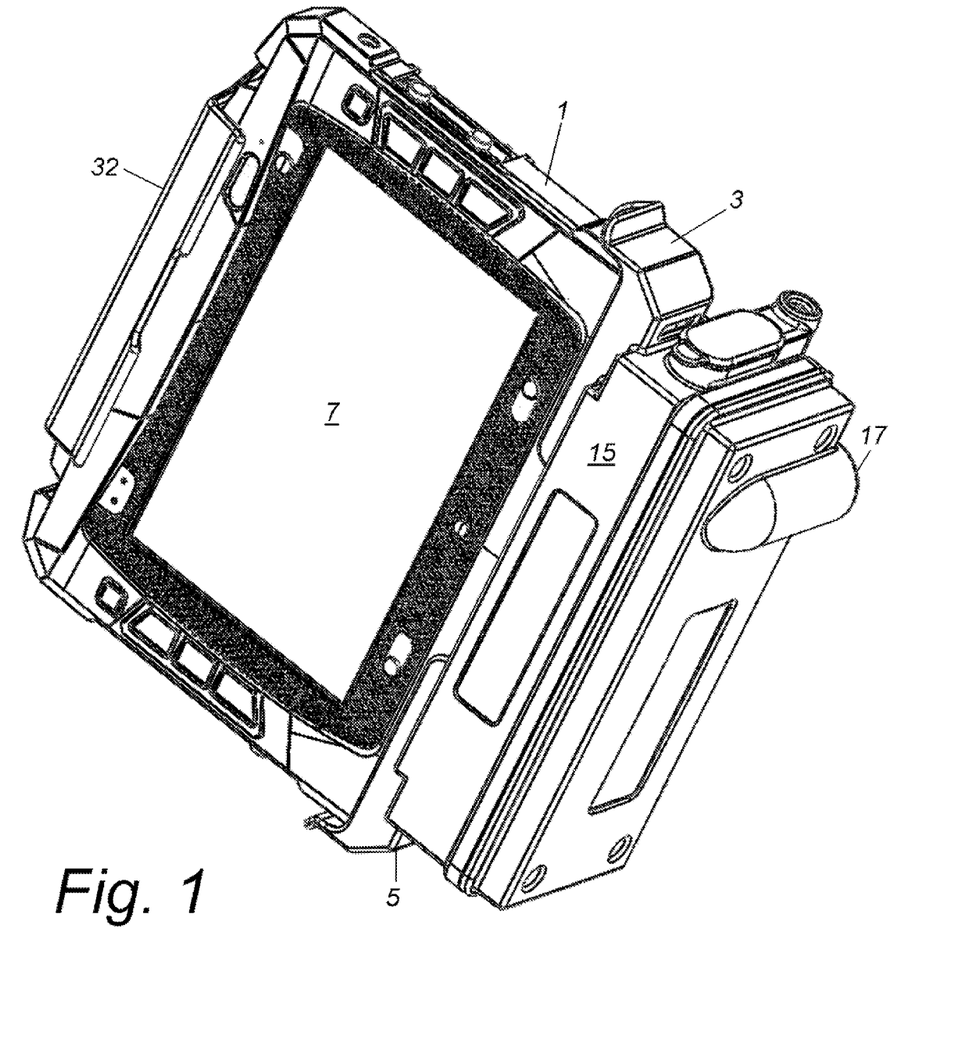
FIG. 1 shows a portable computer or other portable electronic device seated in a docking tray of a docking station which includes an expansion module.

FIG. 1 shows a portable computer or other portable electronic device 1 seated in a docking tray 3 of a docking station 5. Such portable electronic devices 1 are generally provided with one or more connectors and ports for function expansion, usually on the rear face or an edge face (shown in subsequent Figures) of its casing which supports its display unit 7. These portable electronic devices 1 are furnished with additional functions by connecting peripheral devices, such as a hard disk drive, mouse, printer, etc., to the connectors and ports.

Docking tray 3 optionally includes a security mechanism 32, for example but not limited to a variable level security mechanism of the type disclosed in U.S. patent application Ser. Nos. 12/799,658 and 12/799,659, both filed by the inventor of the instant invention and incorporated herein by reference. Security mechanism 32 is structured for securably retaining portable electronic device 1 in docking tray 3 of docking station 5.

As shown here, docking station 5 includes a function expansion module 15, for example, adjacent to docking tray 3. Expansion module 15 includes, for example, a power adaptor port 17 for connecting an external power supply and may also include one or more data input/output (I/O) port, such as Universal Serial Bus (USB) ports or other data transfer ports.

Figure 2:
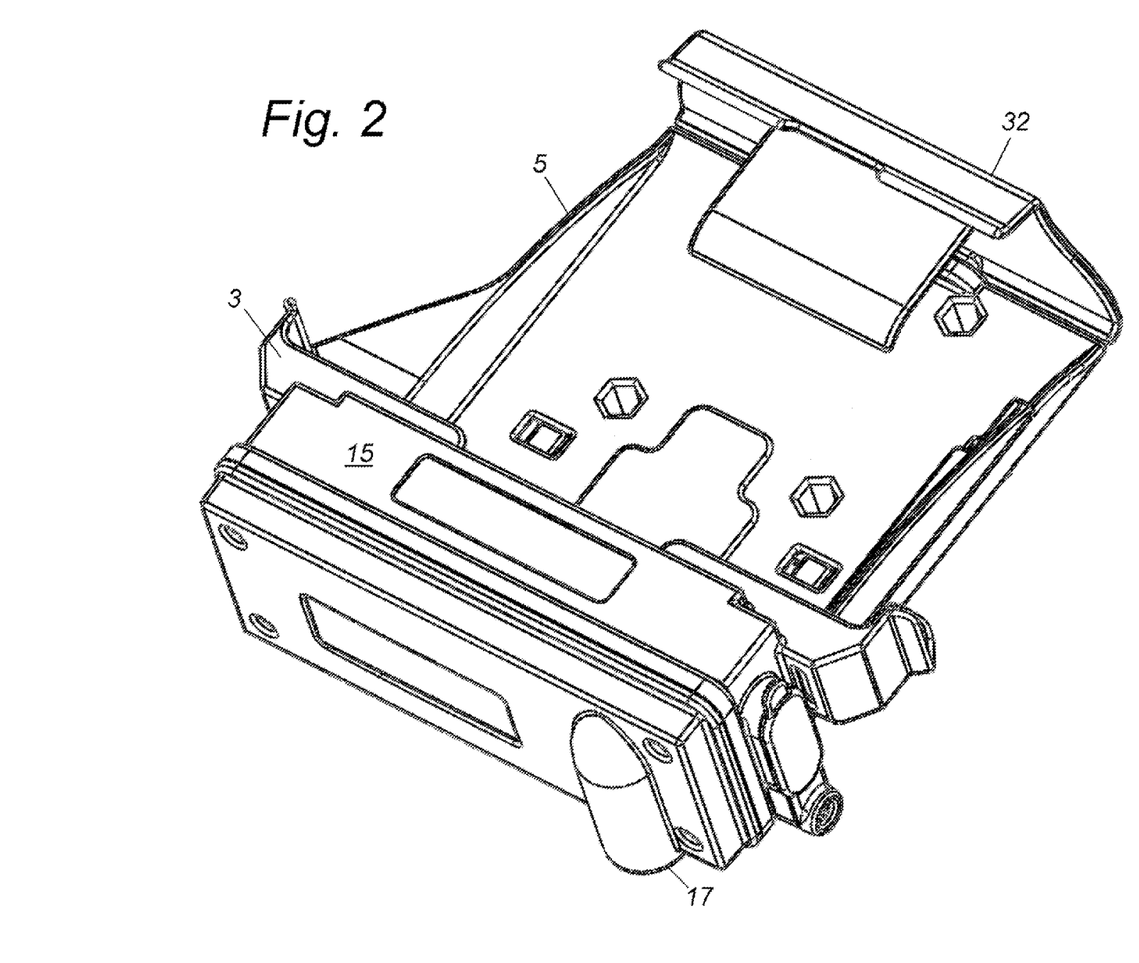
FIG. 2 shows docking station of FIG. 1 with the portable electronic device removed for clarity.

FIG. 2 shows docking station 5 with portable electronic device 1 removed for clarity.

Figure 3:
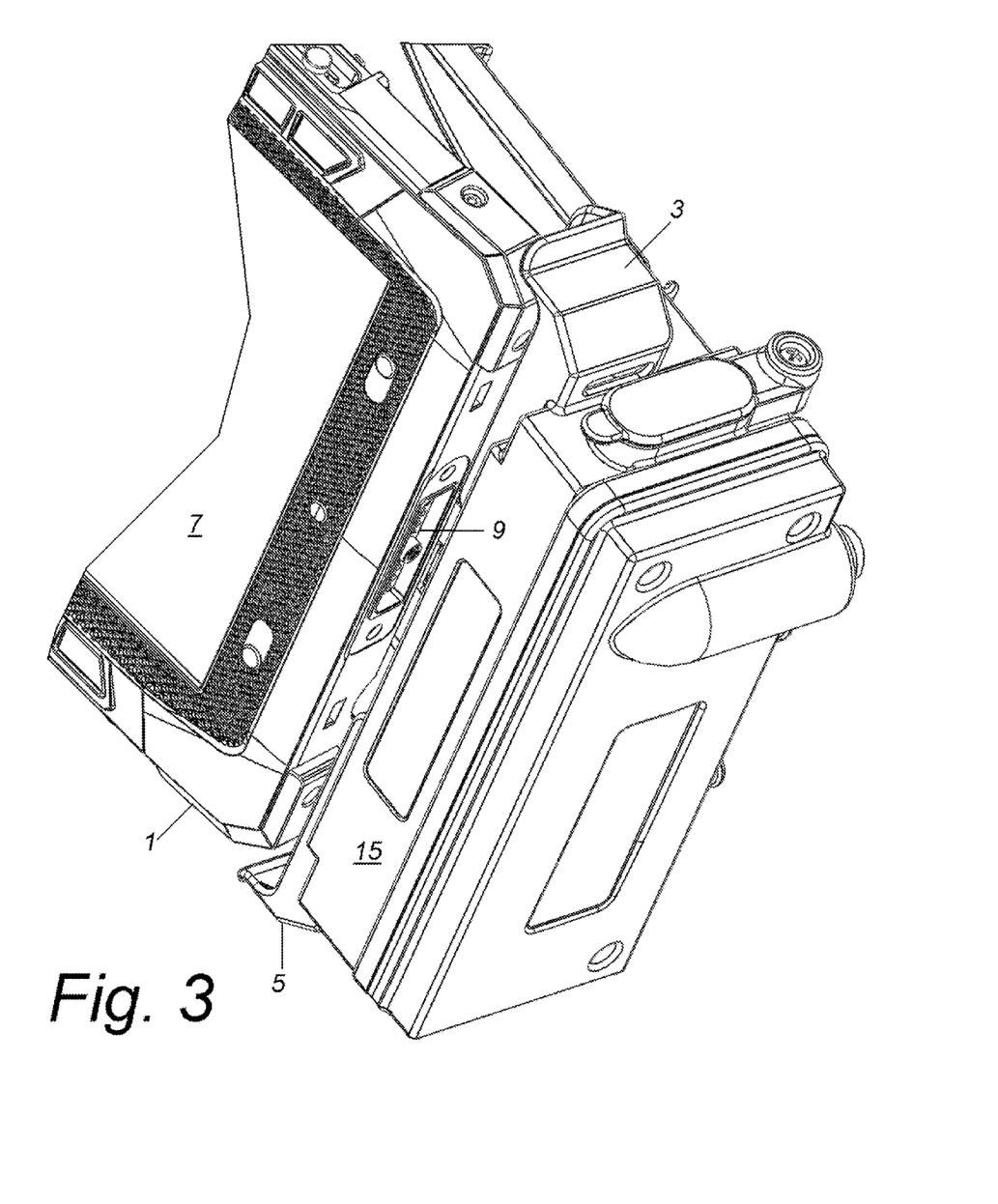
FIG. 3 is a close-up view showing the portable electronic device being seated into the docking tray of the docking station of FIG. 1.

FIG. 3 is a close-up view of portable electronic device 1 being seated into docking tray 3 of docking station 5. Portable electronic device 1 includes an expansion connector port 9 for function expansion thereof. Expansion connector port 9 is structured to receive an electrical expansion connector that is provided in docking tray 3 of docking station 5 for mating with expansion connector port 9 when portable electronic device 1 is seated in docking tray 3.

Figure 4:
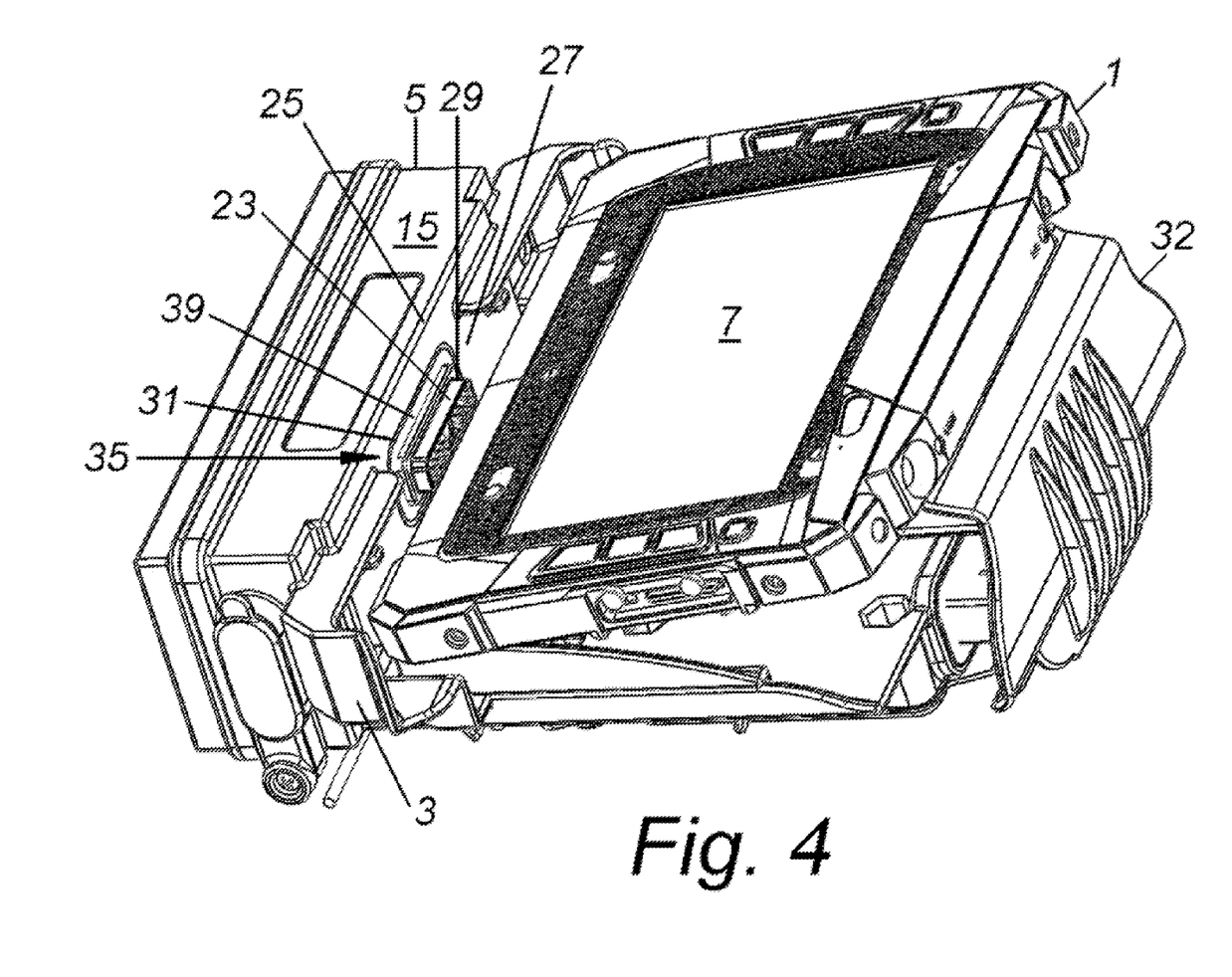
FIG. 4 shows seat of the portable computer or other portable electronic device in the docking tray of the docking station of FIG. 1, which includes the expansion module.

FIG. 4 shows a rigid expansion connector 29 which is an electrical connector selected for coupling with expansion connector port 9 and communicating therewith for expanding one or more functions of electronic device 1, and/or carrying electrical power to electronic device 1. Rigid expansion connector 29 is potted in a rigid interface member 25 of function expansion module 15 which is positioned in the base of docking tray 3 of docking station 5. Expansion connector 29 is thus positioned adjacent to an operational surface 27 of rigid interface member 25 for mating with expansion connector port 9 of portable electronic device 1. For example, electrical expansion connector 29 is projected through an aperture 31 formed through rigid interface member 25. Aperture 31 is sized to permit expansion connector 29 to move laterally in the plane of interface member 25 to reposition sufficiently to mate with expansion connector port 9 when portable electronic device 1 is seated in docking tray 3.

Figure 5:
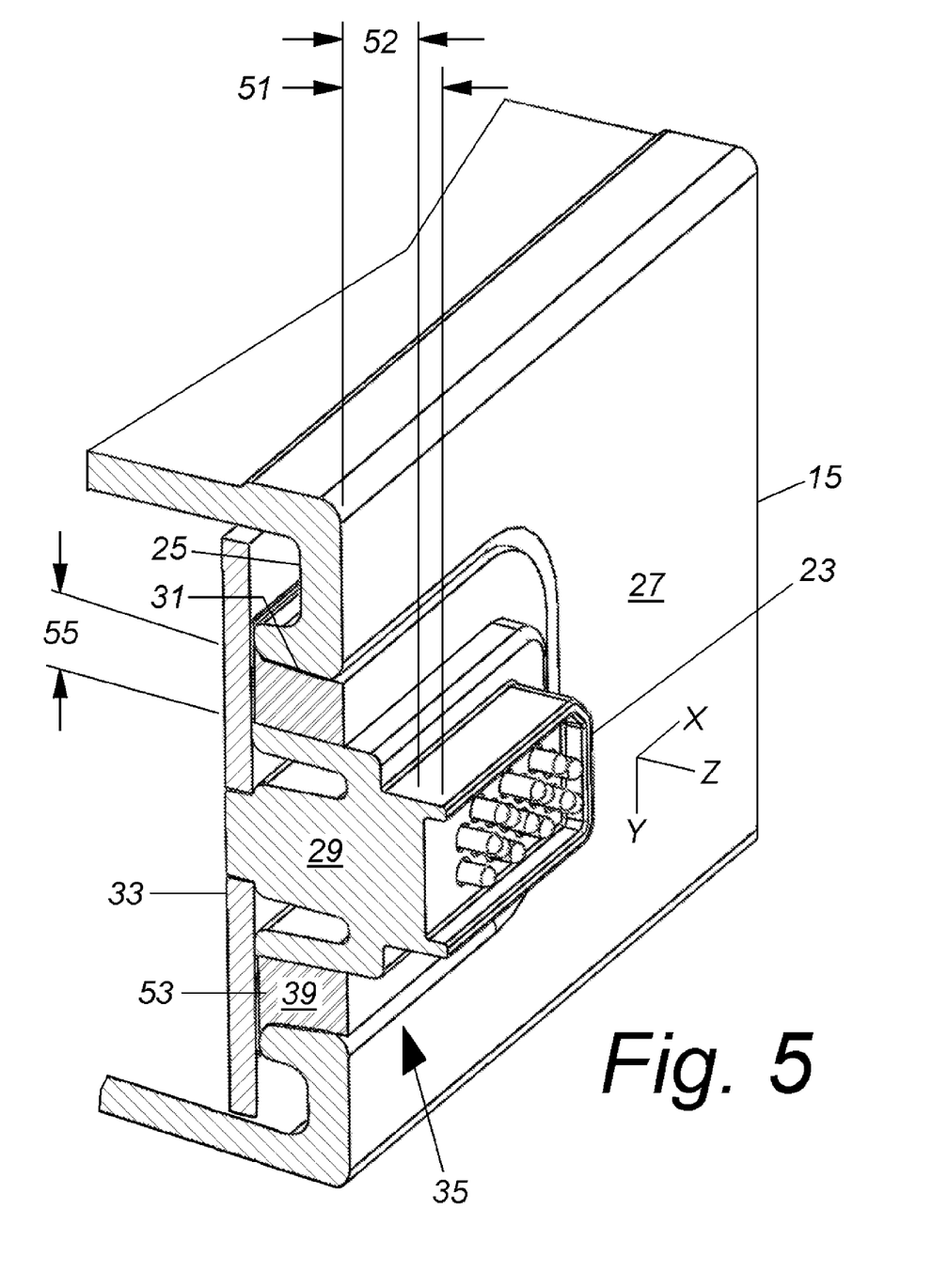
FIG. 5 is a partial cross-section view of the docking station of FIG. 1 with the portable electronic device removed for clarity, wherein the expansion connector is fixedly mounted on a rigid connector carrier member in the expansion module and supported by a connector isolator system having a three dimensional (3-D) elastomeric isolator that isolates expansion connector from shock and vibration.

As shown in FIG. 5, expansion connector 29 is fixedly mounted on a rigid connector carrier member 33 such as a printed circuit board (connector carrier PCB). Connector carrier member 33 optionally operates as an expansion printed circuit board (expansion PCB) in electrical communication with expansion connector 29. Alternatively, expansion module 15 may also include one or more additional expansion printed circuit boards (expansion PCB) in electrical communication with connector carrier member 33, or in direct communication with expansion connector 29, for example, through a flexible ribbon cable extended therebetween, without deviating from the scope and intent of the present invention.

Expansion module 15 includes a connector isolator system 35 having a three dimensional (3-D) elastomeric isolator 39 that isolates expansion connector 29 against lateral motion in the X-Y plane of expansion module interface member 25, and further isolates against out-of-plane motion along the Z-axis perpendicular to the X-Y plane, i.e., along the direction of insertion of expansion connector 29 into expansion connector port 9 of electronic device 1. 3-D elastomeric isolator 39 permits lateral motion in the X-Y plane of interface member 25 within a limited range for mating expansion connector 29 with expansion connector port 9 of portable electronic device 1. However, the in-plane isolation component of isolators 39 permits expansion connector 29 to remain in constant electrical connection with expansion connector port 9 during application of lateral shock and vibration loads applied in the X-Y plane that cause responsive in-plane motion of electronic device 1 within docking tray 3, such that communication is uninterrupted between electronic device 1 and connector carrier member 33.

Were isolator 39 only responsive to lateral X-Y in-plane relative motion of electronic device 1 and expansion connector 29 interfaced with expansion connector port 9 thereof, without responding to out-of-plane Z-axis motion of electronic device 1, shock or vibration inputs that cause out-of-plane separation of electronic device 1 from docking tray 3, even within a limited range, could also cause momentary separation of expansion connector 29 from expansion connector port 9. However, out-of-plane Z-axis isolation component of isolator 39 permits expansion connector 29 to be movable out-of-plane, i.e., along the Z-axis. Out-of-plane Z-axis isolation component of isolator 39 resiliently urges expansion connector 29 into the lateral X-Y in-plane of interface member 25 when compression force on expansion connector 29, either force applied during assembly of expansion connector port 9 or during out-of-plane Z-axis shock or vibration inputs during use, tends to push expansion connector 29 out-of-plane along Z-axis away from X-Y plane of expansion module interface member 25.

FIG. 5 shows details of expansion module 15, wherein expansion connector 29 is mounted on rigid connector carrier member 33, and expansion connector 29 is further mounted in aperture 31 through interface member 25 by means of elastomeric isolator 39. For example, aperture 31 is over-sized relative to expansion connector 29 to permit expansion connector 29 to move laterally in the X-Y plane of interface member 25 to reposition sufficiently to mate with expansion connector port 9 when portable electronic device 1 is seated in docking tray 3. For example, expansion connector 29 is approximately centered in over-sized aperture 31, whereby expansion connector 29 is movable laterally in the X-Y plane of interface member 25. Elastomeric isolator 39 is formed of a flexible elastomeric potting material 53, such as but not limited to liquid silicone or injection molded TPR (thermoplastic rubber) or TPE (thermoplastic elastomer), that bonds to plastics and metals, is waterproof, and remains flexible upon curing. Elastomeric potting material 53 is introduced directly into a continuous gap or space 55 substantially surrounding expansion connector 29 between interface member 25 and expansion connector 29. Upon curing, elastomeric material 53 bonds to both interface member 25 and expansion connector 29 and effectively forms a water-tight and dust-proof seal within space 55, while providing a flexible mounting condition such that expansion connector 29 is capable of floating in all axis, i.e. laterally in the X-Y plane of interface member 25 and out-of-plane in the Z-axis, for shock and vibration absorption. Preferably, elastomeric potting material 53 is a non-conductive electrical insulator material for electrically insulating expansion connector 29 from interface member 25.

Elastomeric isolator 39 further permits expansion connector 29 to move out-of-plane along Z-axis from X-Y plane of interface member 25 within a constant engagement range 51. Constant engagement range 51 is sized to ensure constant engagement of electrical connector 29 with expansion connector port 9 of portable electronic device 1 during out-of-plane Z-axis motion of electronic device 1 within docking tray 3 due to normal shock or vibration inputs that cause out-of-plane separation of electronic device 1 from docking tray 3. For example, constant engagement range 51 is, but not limited to, about 0.060 inch for the present application, wherein shock and vibration regimens result in out-of-plane separation distance 52 of about 0.040 inch of electronic device 1 from docking tray 3, whereby out-of-plane separation distance 52 cannot exceed constant engagement range 51 of out-of-plane Z-axis isolator component of isolator 39. Accordingly, elastomeric potting material 53 is selected in combination with over-sized aperture 31 forming space 55 surrounding expansion connector 29 to provide sufficient plane-in X-Y and out-of-plane Z-axis floating capability appropriate to the application.

The method of mounting a rigid expansion connector 29 in interface member 25 such that expansion connector 29 has some independent three-dimensional floating capability as well as liquid and dust sealing capability includes: selecting elastomeric potting material 53 in combination with over-sized aperture 31 forming space 55 surrounding expansion connector 29 to provide sufficient plane-in X-Y and out-of-plane Z-axis floating capability appropriate to the application; forming aperture 31 in interface member 25 of expansion module 15, which may be integral with docking station 5, wherein aperture 31 is over-sized relative to expansion connector 29; locating expansion connector 29 approximately centered in aperture 31 with a connection portion 23 of electrical connector 29 projected from operational surface 27 of interface member 25; potting expansion connector 29 using a fluid-state elastomeric material 53, such as but not limited to introducing poured liquid silicone or injection molded TPR or TPE, in space 55 directly between expansion connector 29 and interface member 25; and curing elastomeric material 53. When portable electronic device 1 (tablet, phone, portable computer or other instrument) seated in docking station 5 moves in docking tray 3, expansion connector 29 is movable in all three axis, i.e. laterally in the X-Y plane of interface member 25 and out-of-plane in the Z-axis perpendicular to interface member 25, for remaining in fixed relation to portable electronic device 1 for maintaining proper electrical connectivity between expansion connector 29 and expansion connector port 9.

Figure 6:
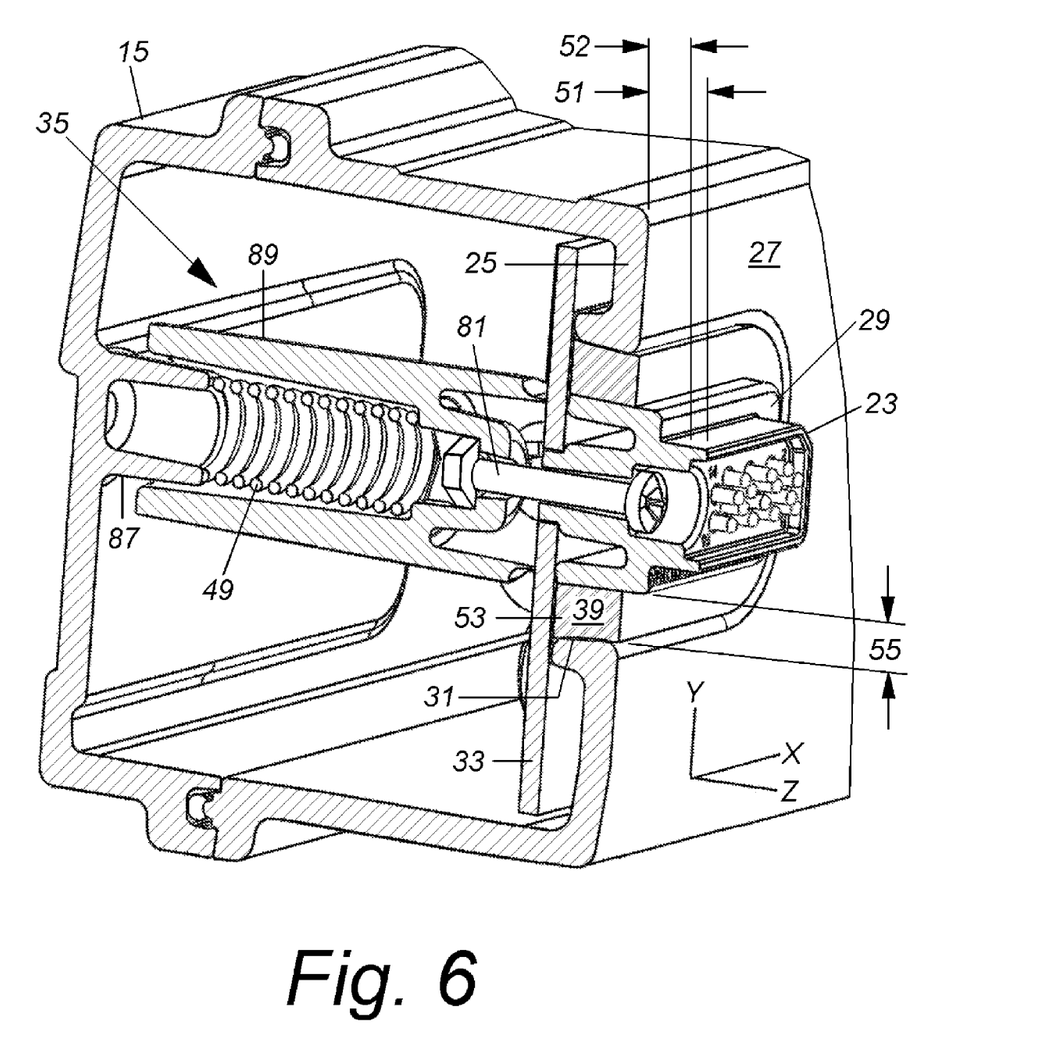
FIG. 6 is a partial cross-section view of the docking station of FIG. 1 with the portable electronic device removed for clarity, wherein the connector isolator system further includes one or more biasing members that positively urge the expansion connector toward the electronic device and into constant engagement with expansion connector port thereof.

FIG. 6 shows details of expansion module 15, wherein connector isolator system 35 includes 3-D elastomeric isolator 39 that permits lateral motion in the X-Y plane of interface member 25, as well as out-of-plane motion along the Z-axis perpendicular to the X-Y plane, i.e., along the direction of insertion of expansion connector 29 into expansion connector port 9 of electronic device 1. The in-plane component of isolator 39 permits lateral motion in the X-Y plane of interface member 25 within a limited range for mating expansion connector 29 with expansion connector port 9 of portable electronic device 1, and which further permits expansion connector 29 to remain in constant electrical connection with expansion connector port 9 during application of lateral shock and vibration loads in the X-Y plane that cause responsive in-plane motion of electronic device 1 within docking tray 3 such that communication is uninterrupted between electronic device 1 and expansion PCB 33 of expansion module 15.

Additionally, the out-of-plane Z-axis isolation component of isolator 39 responds to out-of-plane Z-axis motion of electronic device 1 within docking tray 3. Shock or vibration inputs that normally cause out-of-plane separation of electronic device 1 from docking tray 3 that would normally cause momentary separation of expansion connector 29 from expansion connector port 9 of portable electronic device 1. However, out-of-plane Z-axis isolation component of isolator 39 permits expansion connector 29 to be movable out-of-plane, i.e., along the Z-axis.

Additionally, connector isolator system 35 optionally includes one or more biasing members 49, by example and without limitation coil compression springs (shown), positioned for resiliently urging connector carrier member 33, and expansion connector 29 fixedly attached thereto, out-of-plane along the Z-axis toward security mechanism 32 of docking tray 3. Accordingly, biasing members 49 positively urge expansion connector 29 toward electronic device 1 and into constant engagement with expansion connector port 9, even when shock or vibration inputs cause out-of-plane separation of electronic device 1 from interface member 25 of docking tray 3.

For example, optional biasing members 49 is a conventional compression spring between expansion PCB 33 and a guide post 87 positioned on an opposite surface of expansion module 15 for urging expansion connector 29 out-of-plane along the Z-axis toward operational surface 27 of interface member 25. By example and without limitation, spring 85 is contained within a guide sleeve 89 joined to expansion PCB 33 by means 81 such as a fastener. Sleeve 89 is open at an opposite end from expansion PCB 33 and sized to slide on guide post 87 at least within engagement range 51 of expansion connector 29 as provided by elastomeric isolator 39.

Furthermore, reaction of biasing member 49 against opposite surface of expansion module 15 effectively prevents overtravel of 3-D elastomeric isolators 39 and disengagement of guide sleeve 89 from guide posts 87. Additionally, the length of guide posts 87 can be adjusted to cooperate with a given biasing member 49 to insure continuous engagement of biasing member 49 with guide posts 87. Accordingly, optional biasing members 49 operate to reinforce elastomeric potting material 53 of isolators 39 to maintain expansion connector 29 in positive engagement with expansion connector port 9 of electronic device 1.

While the preferred and additional alternative embodiments of the invention have been illustrated and described, it will be appreciated that various changes can be made therein without departing from the spirit and scope of the invention. Therefore, it will be appreciated that various changes can be made therein without departing from the spirit and scope of the invention. Accordingly, the inventor makes the following claims.

What is claimed is:

1. A method for mounting a rigid electrical connector, the method comprising:
   selecting an electrical connector;
   in a rigid interface member, forming an aperture that is larger than the electrical connector;
   selecting an elastomeric potting material;
   locating the electrical connector in the aperture with a gap between the connector and the aperture of the rigid interface member;
   potting the electrical connector using the elastomeric potting material in a liquid-state thereof; and
   curing the elastomeric potting material in the gap between the electrical connector and the aperture of the rigid interface member, whereby the electrical connector is flexibly mounted in the rigid interface member.

2. The method of claim 1, wherein locating the electrical connector in the aperture further comprises approximately centering the electrical connector in the aperture.

3. The method of claim 1, wherein potting the electrical connector using the elastomeric potting material further comprises positioning the elastomeric potting material in the gap between the electrical connector and the aperture.

4. The method of claim 1, wherein curing the elastomeric potting material further comprises forming a water-tight seal between the electrical connector and the aperture.

5. The method of claim 1, wherein curing the elastomeric potting material further comprises forming an adhesive bond between the elastomeric potting material and each of the electrical connector and the aperture.

6. The method of claim 1, further comprising positioning a biasing member adjacent to the electrical connector opposite from a connection portion of the electrical connector.

7. The method of claim 1, wherein selecting an elastomeric potting material further comprises selecting a flexible elastomeric potting material that bonds to plastics and metals, is waterproof, and remains flexible upon curing.

8. The method of claim 1, wherein selecting an elastomeric potting material further comprises selecting a flexible elastomeric potting material from the group of flexible elastomeric potting material consisting of silicone, and thermoplastic elastomer (TPE).

9. A method for mounting a rigid electrical connector, the method comprising:
- selecting an electrical connector compatible with a predetermined portable electronic device;
- forming an aperture through a rigid interface member that is separate from the electrical connector, wherein the aperture is larger than the electrical connector;
- selecting an elastomeric potting material compatible with both the electrical connector and the rigid interface member;
- locating the electrical connector in the aperture with a space between the electrical connector and the rigid interface member;
- introducing the elastomeric potting material in an uncured state into the space between the electrical connector and the rigid interface member; and
- while maintaining the space between the electrical connector and the rigid interface member, bonding the electrical connector in the aperture of the rigid interface member by curing the elastomeric potting material in the space between the electrical connector and the rigid interface member.

10. The method of claim 9, wherein curing the elastomeric potting material further comprises forming an adhesive bond between the elastomeric potting material and each of the electrical connector and the rigid interface member.

11. The method of claim 10, wherein forming an adhesive bond between the elastomeric potting material and each of the electrical connector and the rigid interface member further comprises forming a water-tight seal between the electrical connector and each of the electrical connector and the rigid interface member.

12. The method of claim 10, wherein locating the electrical connector further comprises approximately centering the electrical connector in the aperture with a space between the electrical connector and the rigid interface member.

13. The method of claim 10, wherein selecting the elastomeric potting material further comprises selecting a flexible elastomeric potting material that remains flexible upon curing.

14. The method of claim 13, wherein selecting the elastomeric potting material further comprises selecting the flexible elastomeric potting material from the group of flexible elastomeric potting material consisting of silicone, and thermoplastic elastomer (TPE).

15. The method of claim 10, wherein selecting a thermoplastic elastomer (TPE) further comprises selecting an injection moldable thermoplastic elastomer (TPE).

16. The method of claim 10, further comprising compressing a biasing member against the electrical connector opposite from an electrical connection portion of the electrical connector.

17. A method for mounting a rigid electrical connector, the method comprising:
- selecting an electrical connector compatible with a predetermined portable electronic device;
- forming an aperture through a rigid interface member, wherein the aperture is larger than the electrical connector;
- selecting an elastomeric potting material that is adhesively bondable to both the electrical connector and the rigid interface member;
- positioning the electrical connector approximately centered in the aperture with a space between the electrical connector and the rigid interface member, with an electrical connection portion of the electrical connector projected from positioned adjacent to an operational surface of the rigid interface member;
- introducing the elastomeric potting material in a fluid-state thereof into the space between the electrical connector and the rigid interface member; and
- bonding the electrical connector in the aperture of the rigid interface member by curing the elastomeric potting material in the space between the electrical connector and the rigid interface member while maintaining the electrical connector approximately centered in the aperture of the rigid interface member.

18. The method of claim 17, further comprising mounting the electrical connector on a printed circuit board (PCB), and mounting the printed circuit board (PCB) in a function expansion module.

19. The method of claim 18, further comprising positioning the function expansion module adjacent to a docking tray of a docking station.

20. The method of claim 17, further comprising positioning a biasing member for urging the electrical connector outwardly of the operational surface of the rigid interface member.

* * * * *